US008056225B2

(12) United States Patent
Spykerman

(10) Patent No.: US 8,056,225 B2
(45) Date of Patent: Nov. 15, 2011

(54) METHOD FOR MANUFACTURING ELECTRICAL CONNECTORS FOR ENHANCING COPLANARITY

(75) Inventor: Conway Francis Spykerman, Singapore (SG)

(73) Assignee: FCI Americas Technology, Inc., Carson City, NV (US)

( * ) Notice: Subject to any disclaimer, the term of this patent is extended or adjusted under 35 U.S.C. 154(b) by 821 days.

(21) Appl. No.: 11/281,789

(22) Filed: Nov. 17, 2005

(65) Prior Publication Data

US 2006/0075634 A1 Apr. 13, 2006

Related U.S. Application Data

(62) Division of application No. 09/650,053, filed on Aug. 29, 2000, now Pat. No. 7,000,317.

(30) Foreign Application Priority Data

Aug. 30, 1999 (SG) .................................. 9904116.2

(51) Int. Cl.
*H01R 43/00* (2006.01)
*H01K 3/22* (2006.01)
*H05K 13/00* (2006.01)

(52) U.S. Cl. ................. 29/883; 29/848; 29/856; 29/858

(58) Field of Classification Search .............. 29/83, 848, 29/856, 883, 858; 264/272.11, 272.15, 274, 264/275, 279, 328.12; 439/70
See application file for complete search history.

(56) References Cited

U.S. PATENT DOCUMENTS 4,231,628 A * 11/1980 Hughes et al. ................ 439/676
4,501,465 A * 2/1985 Hoshino et al. ............... 439/633
4,710,134 A * 12/1987 Korsunsky .................... 439/264
4,817,283 A * 4/1989 Johnston et al. ................ 29/884
5,167,528 A * 12/1992 Nishiyama et al. ........... 439/489
5,176,541 A * 1/1993 Mori ............................ 439/736
5,355,282 A 10/1994 Yokemura et al. ............ 361/760
6,048,482 A * 4/2000 Lemke et al. ................ 264/251
6,076,258 A * 6/2000 Abe ............................... 29/883
6,217,393 B1 * 4/2001 Muta ............................ 439/736

FOREIGN PATENT DOCUMENTS

JP 09 286 040 11/1997

* cited by examiner

*Primary Examiner* — A. Dexter Tugbang
*Assistant Examiner* — David Angwin
(74) *Attorney, Agent, or Firm* — Woodcock Washburn LLP

(57) ABSTRACT

The present invention is a method for manufacturing an electrical connector comprising an insulative housing with a base side and an opposed side and lateral sides interposed between said base side and said opposed side and at least one conductive contact including a first leg that extends from the base side of the insulative housing, the at least one conductive contact further including a second leg extending laterally adjacent the top side of the housing. In this method there is provided a mold comprising a first die and an opposed second die all defining an interior cavity and an exterior area. A molding compound input port extends between the exterior area and the interior cavity. The conductive contact is then positioned in the interior cavity such that the second leg extends adjacent the second die along an entirety of a length of the second die between first and second bent ends. The interior cavity of the mold is then filled with a polymeric molding compound, and during at least a portion of the filling step, the second die is maintained in contact with the second leg along the entirety of the length.

7 Claims, 3 Drawing Sheets

METHOD FOR MANUFACTURING ELECTRICAL CONNECTORS FOR ENHANCING COPLANARITY

This is a divisional of U.S. application Ser. No. 09/650,053, filed Aug. 29, 2000, now issued as U.S. Pat. No. 7,000,317, the contents of which is incorporated by reference herein in its entirety.

BACKGROUND OF THE INVENTION

1. Field of the Invention:

The present invention is related to electrical connectors and more particularly to methods for making electrical connectors.

2. Brief Description of Earlier Developments:

In the manufacture of many types of electrical connectors, contacts are positioned in a mold after which the mold is filled with a suitable molding compound which is allowed to harden to form an insulative housing surrounding the contact. Referring, for example, to FIGS. 1*a* and 1*b*, the mold is shown generally at numeral 10 and has an upper die 12 and an opposed lower die 14. The mold also has an interior section 16 and an exterior section 18 with a connecting molding compound injection port 20. There is also a contact receiving aperture 22 in the base of the lower die 14. A conductive contact 24 is positioned in the contact and receiving aperture 22. The contact 24 has a vertical leg 26 with a contact terminal 28. It also has a horizontal leg 30 with an oblique section 32 and a terminal horizontal section 34.

Referring particularly to FIG. 1*a*, a molding compound is introduced to the interior 16 of the mold 10 through the injection port 20. At the beginning of the injection process, the molding compound begins to fill the interior 16 of the mold 10 around the lead contact 24. Referring particularly to FIG. 1*b*, however, as the interior 16 of the mold 10 begins to approach its capacity the pressure of the molding compound may cause the contact to be flexed and displace it from its original position. For example, in FIG. 1*b*, the front of the horizontal leg 30 as the contact 24 is flexed downwardly and molded compound enters the space 36 between the contact 24 and the upper die 12. Referring to FIG. 1*c*, the filling of the interior 16 of the mold 10 in the way shown in FIG. 1*b* may result in hardened molding compound 38 in position above the horizontal leg 30 in the completed connector. Referring to FIG. 1*d*, it may also be possible that hardened molding compound 40 may be superimposed over the inner side of the horizontal leg 30 so that the leg extends obliquely upwardly as is shown in FIG. 1*d*. Consequently there may be an undesirable defecit in coplanarity between the upper horizontal leg 30 of the contacts and the upper surface of the housing.

A need therefore exists for a way to improve molding procedures to reduce the incidents of lack of coplanarity between the upper horizontal leg of the contact and the upper surface of the housing.

SUMMARY OF THE INVENTION

The present invention is a method for manufacturing an electrical connector comprising an insulative housing with a base side and an opposed side and lateral sides interposed between said base side and said opposed side and at least one conductive contact extending from the base side of the insulation in a first leg and then laterally adjacent the top side of the housing in a second leg. In this method there is provided a mold comprising a first die and an opposed second die all defining an interior cavity and an exterior area. A molding compound input port extends between the exterior area and the interior cavity and a contact receiving aperture extending through the first die from the exterior area to the interior cavity. The conductive contact is then positioned so that the first leg extends upwardly from the exterior area through the contact receiving aperture into the interior cavity. The first leg extends through said interior cavity, and the second leg extends laterally adjacent the opposed die. The interior cavity of the mold is then filled with a polymeric molding compound, and force is applied on the second leg to cause the second leg of the contact to bear against the second die.

BRIEF DESCRIPTION OF THE DRAWINGS

The present invention is further described with reference to the accompanying in which.

DETAILED DESCRIPTION OF THE PREFERRED EMBODIMENTS

Figure 1A:
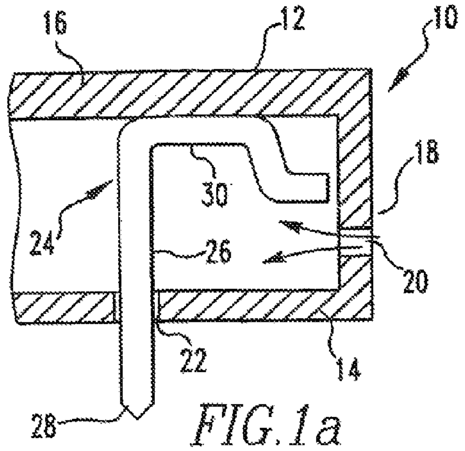
FIG. 1a PRIOR ART
FIGS. 1*a* and 1*b* are cross sectional schematic views showing two stages in the injection of molding compound during the prior art method of manufacturing electrical connectors.
Figure 1B:
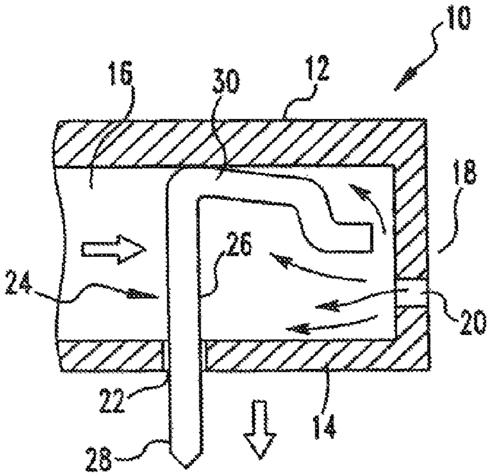
FIG. 1b PRIOR ART
Figure 1C:
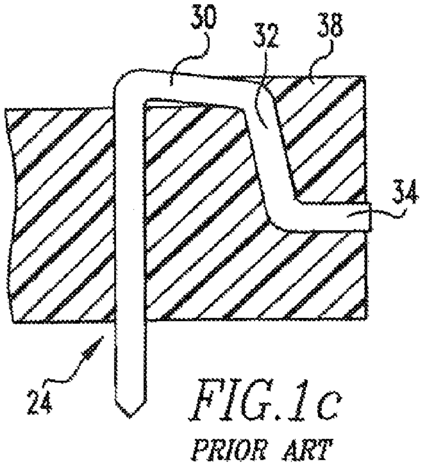
FIG. 1c PRIOR ART
FIGS. 1*c* and 1*d* are cross sectional schematic views of prior art electrical connectors which may result from the use of the method illustrated in FIGS. 1*a* and 1*b;*
Figure 1D:
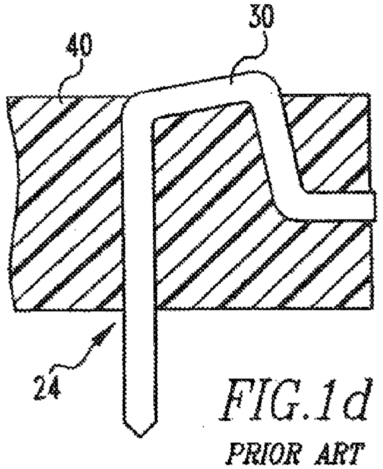
FIG. 1d PRIOR ART
Figure 2:
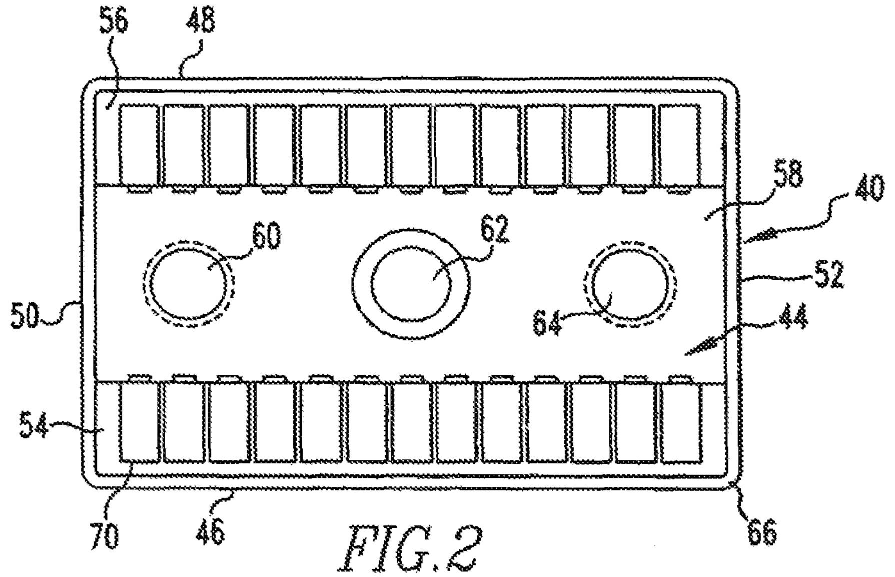
FIG. 2 is a top plan view of the preferred embodiment of an electrical connector manufactured according to the method of the present invention.
Figure 3:
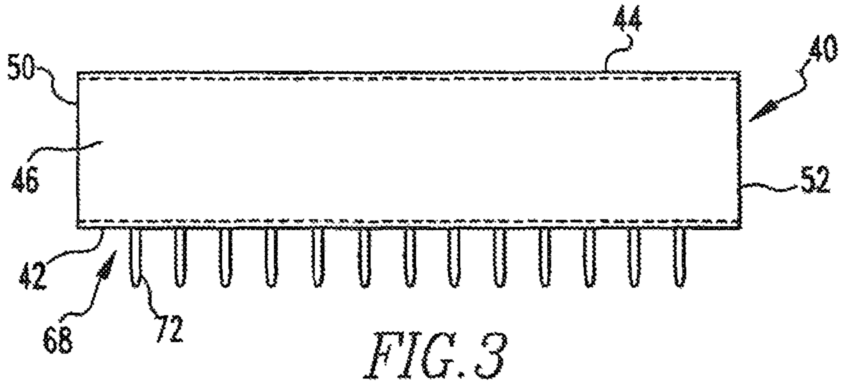
FIG. 3 is a side elevational view of the electrical connector shown in FIG. 2.
Figure 4:
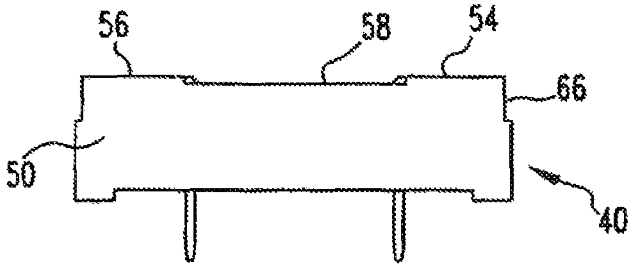
FIG. 4 is an end view of the electrical connector shown in FIG. 2.
Figure 5:
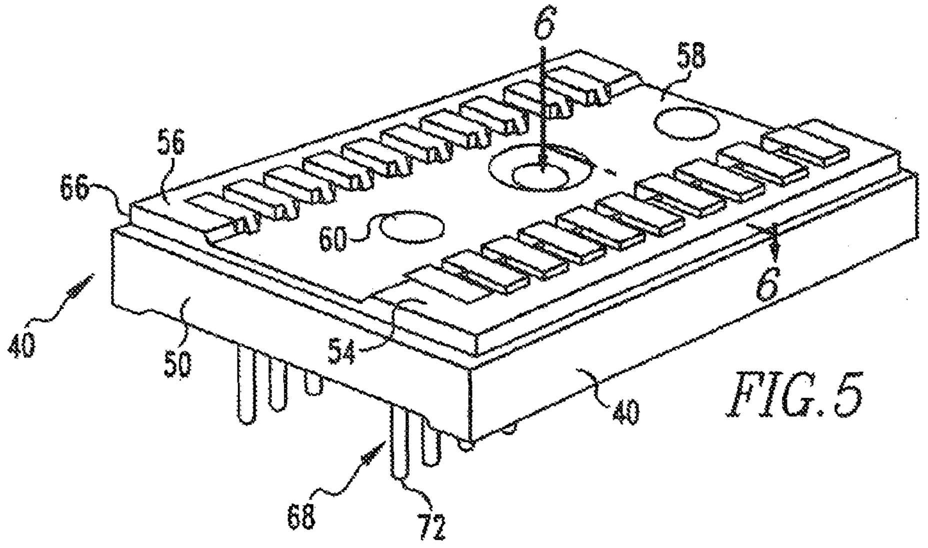
FIG. 5 is a perspective view of the electrical connector shown in FIG. 2.

Referring to FIGS. 2-5, a connector made according to the method of the present invention includes an insulative housing 40 which has a base side 42, a top side 44, a front lateral side 46 and a rear lateral side 48. This housing 40 also has opposed end lateral sides 50 and 52. On the top surface 44 there are opposed lateral raised areas 54 and 56 and a central recessed area 58. In the central recessed area 58 and extending vertically through the housing 40, mounting apertures 60, 62 and 64. Along the edge of the top surface 44 there is a peripheral recess 66. Extending vertically through the housing and then positioned on the lateral raised areas 54 and 56 of the top surface 44, there are a plurality of contacts as at contact 68. This contact 68 includes, as does the other contacts, an upper solder tab 70 and a lower contact terminal 72.

Figure 6:
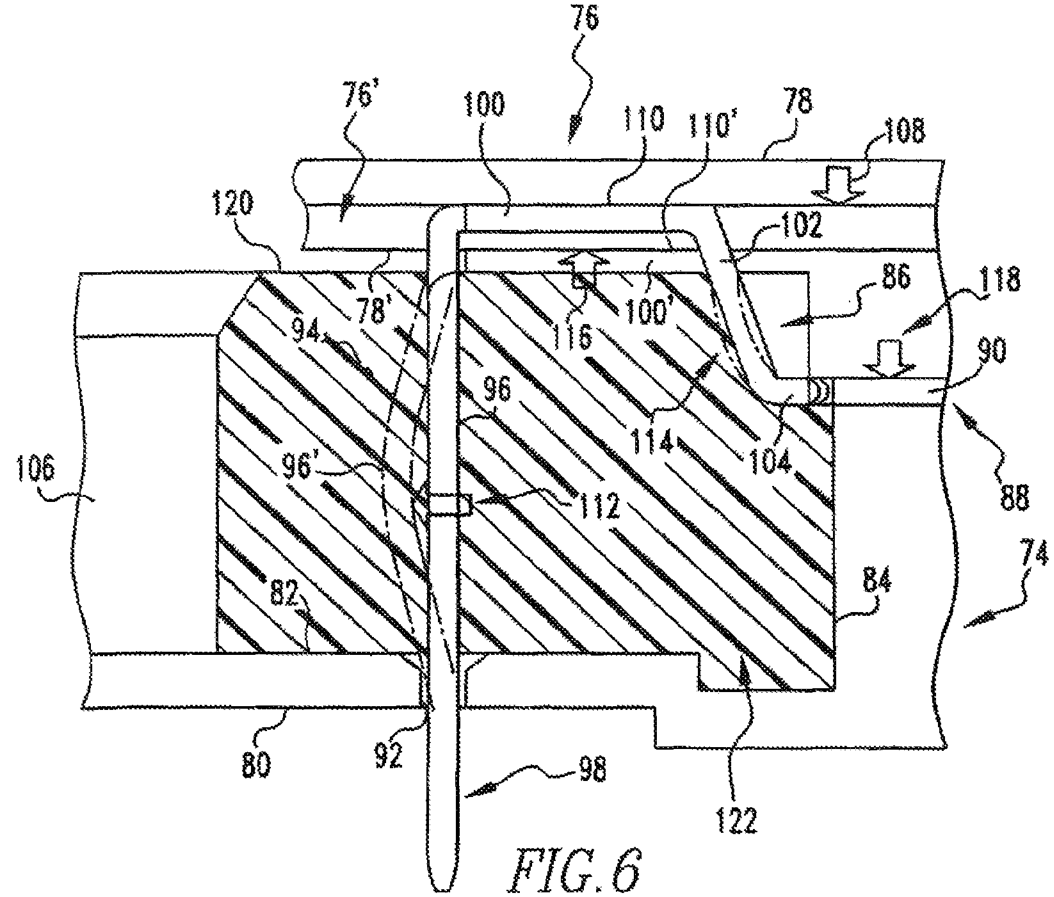
FIG. 6 is a schematic partial cross sectional view of the connector through 6-6 in FIG. 5 illustrating the method of the present invention.

Referring to FIG. 6, a mold is shown generally at numeral 74. This mold 74 includes a movable upper die 76 which includes a mold top surface 78. The mold 74 also includes stationery lower die 80 which includes a bottom surface 82 and lateral surfaces as at surface 84. The mold has an interior 86 which is connected to an exterior area 88 by means of a molding compound injection port 90. In the bottom surface 82 of the lower die 80 there is a contact receiving aperture 92. A contact shown generally at numeral 94 is engaged with the contact receiving aperture 92. This contact 94 has a vertical leg 96 with a terminal 98 that extends outwardly from the lower die 80. The vertical leg 96 also extends upwardly to adjacent the top surface 78 of the movable upper die 76. At this point the terminal extends laterally in a horizontal leg 100. An oblique section 102 extends in a forward and downward direction to horizontal mid-section 104. There is also a post 106 which forms an aperture in the housing.

A force 108 acts on the upper edge 110 of the horizontal legs 100 of the contact 94. This force results in contacts bends 112 which displaces the vertical leg through 96'. The oblique section also has a bend 114. such forced results in a generation of an equal and opposite force 116 in a force 118 which serves as a mold shut off. As a result of a generation of this equal and opposite force 118 molding compound is prevented from being positioned between the top edge 110' of the horizontal leg 100' and the interior surface 78' of the upper die 76' of the mold. Consequently, the horizontal leg 100' of the contact 94, which may be a solder pad, will be coplanar or at least parallel with the upper surface 120 of the completed housing 122.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method for manufacturing an electrical connector comprising an insulative housing with a base side and an opposed side and lateral sides interposed between said base side and said opposed side and at least one conductive contact including a first leg that extends from the base side of the insulative housing, the at least one conductive contact further including a second leg extending laterally adjacent the top side of the housing, said method comprising the steps of:

(a) providing a mold comprising a first die and an opposed second die all defining an interior cavity and an exterior area, and a molding compound input port extending between the exterior area and the interior cavity;

(b) then positioning the at least one conductive contact in the interior cavity such that the second leg extends adjacent the second die, wherein the second leg defines a first bent end and an opposed second bent end, the first bent end is connected to the first leg, the second bent end is connected to a non-horizontal oblique portion of the at least one contact, the second leg extends substantially horizontally along a length from the first bent end to the second bent end, and the second leg defines a die-facing surface along an entirety of the length, the die-facing surface facing the second die;

(c) then filling the interior cavity of the mold with a polymeric molding compound; and (d) during at least a portion of the filling step, maintaining the second die in contact with the die-facing surface of the second leg along the entirety of the length.

2. The method of claim 1, wherein prior to step (c), the second leg is not in contact with the second die.

3. The method of claim 1, wherein the second leg of the at least one conductive contact has an upper edge and a length, and the upper edge is in contact with the second die.

4. The method of claim 1, further comprising the step of applying a force from the mold to an edge of the second leg sufficient to cause the second leg of the contact to displace.

5. The method of claim 1, wherein step (d) further comprises applying a force to the second leg sufficient to prevent polymeric molding compound from flowing between the second leg and the second die.

6. The method of claim 1, wherein step (a) further comprises providing a contact receiving aperture extending through the first die from the exterior area and the interior cavity, and step (b) further comprises positioning the at least one conductive contact such that the first leg extends upwardly from the exterior area through the contact receiving aperture into in the interior cavity and then through said interior cavity such that the second leg extends adjacent the second die.

7. The method of claim 5, wherein step (d) further comprises applying the force with the second die so as to cause the length of the second leg to displace.

* * * * *